(12) United States Patent
Takematsu et al.

(10) Patent No.: US 6,626,722 B2
(45) Date of Patent: Sep. 30, 2003

(54) METHOD FOR SELECTING COMBINATION OF HOST MATERIAL AND LIGHT-EMITTING MATERIAL, AND ORGANIC LIGHT-EMITTING DEVICE USING COMBINATION SELECTED THEREBY

(75) Inventors: Masakazu Takematsu, Kanagawa-ken (JP); Masayuki Mishima, Saitama-ken (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 220 days.

(21) Appl. No.: 09/845,342

(22) Filed: May 1, 2001

(65) Prior Publication Data

US 2002/0030441 A1 Mar. 14, 2002

(30) Foreign Application Priority Data

May 2, 2000 (JP) ........................................ 2000-133729

(51) Int. Cl.$^7$ .................................................. H01J 9/24
(52) U.S. Cl. ............................. 445/24; 445/23; 445/25; 445/22; 445/26; 313/503; 313/504; 313/506
(58) Field of Search .............................. 445/23, 24, 25, 445/22; 313/504, 503, 506, 509, 512, 351

(56) References Cited

U.S. PATENT DOCUMENTS

| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |
| 5,672,938 A | * 9/1997 | Jones |
| 6,016,033 A | * 1/2000 | Jones et al. |
| 6,307,317 B1 | * 10/2001 | Codama et al. |
| 6,392,339 B1 | * 5/2002 | Aziz et al. |

OTHER PUBLICATIONS

M. A. Baldo et al., "Very high–efficiency green organic light–emitting devices based on electrophosphorescence", *Appl Phys. Lett.*, vol. 75, No. 1, Jul. 5, 1999, pp. 4–6.

Tetsuo Tsutsui et al., "High Quantum Efficiency in Organic Light–Emitting Devices with Iridium–Complex as a Triplet Emissive Center", *Jpn. J. Appl. Phys.*, vol. 38, Dec. 15, 1999, pp. L1502–1504.

C. W. Tang et al., "Organic electroluminescent diodes", *Appl. Phys. Lett.*, vol. 51, No. 12, Sep. 21, 1987, pp. 913–915.

* cited by examiner

*Primary Examiner*—Dean A. Reichard
*Assistant Examiner*—Nguyen Ha
(74) *Attorney, Agent, or Firm*—Sughrue Mion, PLLC

(57) ABSTRACT

A method for selecting a combination of a host material and a light-emitting material to be used for a light-emitting layer of an organic light-emitting device, involving the steps of: (a) disposing a mixture film containing a host material and a light-emitting material on a substrate; and (b) evaluating the mixture film with respect to light-emitting properties while irradiating a light that is absorbed by the host material to the mixture film. An organic light-emitting device with a light-emitting layer containing the combination of the host material and the light-emitting material selected by the method is also provided.

11 Claims, No Drawings

METHOD FOR SELECTING COMBINATION OF HOST MATERIAL AND LIGHT-EMITTING MATERIAL, AND ORGANIC LIGHT-EMITTING DEVICE USING COMBINATION SELECTED THEREBY

BACKGROUND OF THE INVENTION

The present invention relates to a method for selecting a combination of a host material and a light-emitting material to be used for a light-emitting layer of an organic light-emitting device, and an organic light-emitting device using the combination of the host material and the light-emitting material selected by the method.

Organic light-emitting devices generally comprise a light-emitting layer of a light-emitting material disposed between an electron-injecting electrode (negative electrode) and a hole-injecting electrode (positive electrode). Electrons and holes are injected into the light-emitting layer and recombined therein to produce excitons, and the excitons are deactivated so that the light-emitting material emits fluorescence and/or phosphorescence. C. W. Tang, et al. have demonstrated in 1987 that an organic light-emitting device where a positive electrode, an organic hole-transporting layer, a light-emitting layer, an organic electron-transporting layer and a metal negative electrode are laminated on a glass substrate can be driven by a lowered applying voltage. Since then, organic light-emitting devices have been considered to be useful as a novel displaying device for flat panel displays, etc., and much attention has been paid thereto. However, the organic light-emitting devices are inferior in light-emitting efficiency to inorganic LED devices and fluorescent tubes, thereby being far from practicable. Most of the conventional organic light-emitting devices are such that utilizes fluorescence provided by singlet excitons in the organic light-emitting material. According to simple mechanism in quantum chemistry, ratio of the singlet excitons providing fluorescence to triplet excitons providing phosphorescence is $1/3$ in an excitation state. Therefore, the organic light-emitting devices utilizing the fluorescence can practically apply only 25% of the excitons, thereby inevitably being poor in the light-emitting efficiency.

M. A. Baldo, et al. have disclosed that an organic light-emitting device comprising a light-emitting layer composed of 100 weight % of 4,4'-N,N'-dicarbazole biphenyl (CBP) and 6 weight % of tris(2-phenylpyridine) iridium complex $(Ir(ppy)_3)$ exhibits a high external quantum efficiency of 7.5% (M. A. Baldo, et al., Appl. Phys. Lett., Vol. 75, Page 4 (1999)). It has been supposed that this organic light-emitting device utilizes phosphorescence provided by the triplet excitons in $Ir(ppy)_3$. After this disclosure, some proposals have been made to an organic light-emitting device excellent in the light-emitting efficiency, for example, Tsutsui, et al. have obtained 13.7% of the external quantum efficiency (T. Tsutsui, et al., Jpn. J. Appl. Phys., Vol. 38, Page L1502 (1999)). However, the organic light-emitting devices are required to have further improved light-emitting efficiency and luminance to be put into practical use.

To improve the light-emitting efficiency and the luminance of the organic light-emitting device, structure or materials thereof should be improved. Known as an organic light-emitting device having an improved structure is such as disclosed by above-mentioned T. Tsutsui, et al., etc. On the other hand, the materials for the organic light-emitting device have not been improved, the materials superior to the combination of the host material CBP and the light-emitting material $Ir(ppy)_3$ having not been known. This is because long period of time is necessitated to evaluate the materials. Since light-emitting mechanism of the organic light-emitting device, in particular, such that utilizes triplet excitons, has not yet been sufficiently solved, the materials must be evaluated after practically producing the device. The production of the device requires a plurality of processes including vacuum deposition, so that a plurality of the devices cannot be produced at the same time in the same apparatus. Therefore, selecting a preferred combination of a host material and a light-emitting material have needed remarkably long period of time, and it has been highly desired to develop a method for easily selecting or screening the preferred combination.

OBJECT AND SUMMARY OF THE INVENTION

An object of the present invention is to provide a method for easily selecting a preferred combination of a host material and a light-emitting material to be used for a light-emitting layer of an organic light-emitting device, and to provide an organic light-emitting device containing the combination selected by the method to exhibit a high light-emitting efficiency.

As a result of intense research in view of the above object, the inventor has found that a preferred combination of a host material and a light-emitting material can be easily selected by evaluating light-emitting properties of a mixture film containing a light-emitting material and a host material without production of organic light-emitting devices using different materials from each other. The present invention has been accomplished by the finding.

Thus, a method of the present invention for selecting a combination of a host material and a light-emitting material to be used for a light-emitting layer of an organic light-emitting device comprises the steps of: (a) disposing a mixture film containing a host material and a light-emitting material on a substrate; and (b) evaluating the mixture film with respect to light-emitting properties while irradiating a light that is absorbed by the host material to the mixture film.

In the method of the present invention, on the mixture film side surface of the substrate is preferably provided an inert polymer layer. The inert polymer layer is preferably made of poly(methylmethacrylate) (PMMA). Further, the mixture film is preferably disposed by applying a solution containing the host material and the light-emitting material to the substrate, and by drying the applied solution. Weight ratio of the light-emitting material is preferably 1 to 10 weight % to the host material in the mixture film.

An organic light-emitting device of the present invention comprises a pair of electrodes and a light-emitting layer disposed therebetween, the light-emitting layer containing a combination of a host material and a light-emitting material selected by the above-mentioned method of the present invention. In the organic light-emitting device of the present invention, the light-emitting layer is particularly preferably such that is disposed by a vacuum deposition method, and weight ratio of the light-emitting material is preferably 1 to 10 weight % to the host material in the combination. Absorbance to the light that is absorbed by the host material of the light-emitting material is preferably $1/5$ or less to that of the host material.

DETAILED DESCRIPTION OF THE PREFERRED EMBODIMENTS

[1] Method for Selecting Combination of Host Material and Light-Emitting Material A method of the present invention is for selecting a combination of a host material and a light-emitting material to be used for a light-emitting layer of an organic light-emitting device. The method comprises the steps of: (a) disposing a mixture film containing a host material and a light-emitting material on a substrate; and (b) evaluating the mixture film with respect to light-emitting properties while irradiating a light that is absorbed by the host material to the mixture film. The method can be utilized for production of an organic light-emitting device excellent in light-emitting efficiency. Incidentally, the terms "host material" and "light-emitting material" as used herein may mean candidate materials for the host material and the light-emitting material to be used for the light-emitting layer of the organic light-emitting device, respectively.

By the method of the present invention, a combination of a host material and a light-emitting material such that the organic light-emitting device using the combination exhibits easy energy transfer and high light-emitting efficiency can be easily selected from host materials such as carbazole compounds (CBP, etc.) and light-emitting materials such as organic heavy metal complexes ($Ir(ppy)_3$, etc.). The steps in the method will be described in detail below.

(a) Disposing Mixture Film

The combination of the host material and the light-emitting material has been supposed to be evaluated in a fashion as a pellet of a fine mixture or a mixture solution. However, according to the pellet, remarkably long period of time is required to increase the mixing uniformity thereof, it being extremely difficult to completely mix the materials in molecular level. Further, according to the mixture solution, an average intermolecular distance of the materials therein is so long, that energy transfer is hardly achieved between the materials. Thus, in the method of the present invention, the mixture film containing the host material and the light-emitting material is disposed on a substrate to be evaluated.

The mixture film may be disposed on the substrate by a vacuum deposition method, or by applying a solution composed of the materials dissolved in a solvent. The vacuum deposition method cannot provide a plurality of the mixture films at the same time in the same apparatus, to be not suitable for the purpose of efficient selection. Thus, the mixture film is preferably disposed by applying the solution containing the host material and the light-emitting material to the substrate, and by drying the applied solution.

The solvent for the solution containing the host material and the light-emitting material is not particularly limited if only it can dissolve both of the host material and the light-emitting material. The solvent may be dichlorethane, chloroform, toluene, etc. When the solution is applied to the substrate by dropping, the amount of the applied solution per the surface area thereof is too large to dry the solution in a short time, whereby the host material and the light-emitting material tend to be separately deposited to provide the mixture film where the materials are not mixed uniformly in molecular level. Thus, it is preferable that the solution is applied to the substrate by a spin-coating method, a bar-coating method, a roll-coating method, a dip-coating method, etc. from the viewpoints of drying the applied solution in a short time not to cause separate deposition of the host material and the light-emitting material. Among the methods, particularly preferred is a spin-coating method capable of rapidly and precisely applying the solution to the substrate.

In the solution mentioned above, weight ratio of the light-emitting material is preferably 1 to 10 weight % to the host material. When the weight ratio is less than 1 weight %, abundance of the light-emitting material is reduced in a region where the light-emitting material can be transferred energy from the excited host material to, whereby energy transfer between the host materials inevitably affects selection of the combination. On the other hand, when the weight ratio is more than 10 weight %, energy transfer between the light-emitting materials is frequently caused, resulting in deactivation of the light-emitting material without radiation, a so-called concentration quenching.

The substrate used in the method according to the present invention preferably has resistance to the above solution, and no absorption and fluorescence properties in the excitation wavelength range and in the evaluation wavelength range of the mixture film. The substrate is preferably a glass substrate made of Pyrex glass, soda glass, etc. Although plastic substrates made of polyethylene terephthalate (PET), triacetylcellulose (TAC), etc. are not preferred from the viewpoint of the solvent resistance, they are preferably used by providing a protection layer of silicon nitride, silicon oxide, etc. thereon.

In the case where the substrate repels the above-mentioned solution, the solution cannot be uniformly applied to the substrate. For example, the glass substrate tends to repel the solution using dichlorethane, chloroform, etc. In this case, the mixture film side surface of the substrate is preferably subjected to an appropriate treatment. The treatment may be such that on the surface is provided an inert polymer layer, or that the surface is silanized to change polarity thereof. Of these treatments, because a toxic gas such as chlorine gas or high heat is inevitably produced when the surface is silanized, it is preferred that the inert polymer layer is provided on the surface.

The inert polymer for use in the inert polymer layer is not particularly limited if only it has no absorption and fluorescence properties in the excitation wavelength range and in the evaluation wavelength range of the mixture film. The inert polymer may be polyethylene, polystyrene, poly (methylmethacrylate) (PMMA), etc. Among them, preferred is PMMA, which is soluble in acetone suitable for the glass substrate.

(b) Evaluation of Mixture Film

The combination of the host material and the light-emitting material is selected by evaluating the above-mentioned mixture film with respect to light-emitting properties. The light-emitting properties are preferably evaluated by a fluorescence spectrum-measuring apparatus. The mixture film is evaluated while irradiating an excitation light that is absorbed by the host material to the mixture film. It is preferable that the light is absorbed substantially only by the host material, hardly by the light-emitting material. In other words, the absorbance to the light of the light-emitting material is preferably $\frac{1}{5}$ or less, more preferably $\frac{1}{10}$ or less to that of the host material. Phosphorescence spectrum corresponding substantially to the light-emitting material is observed when the excitation light at a proper wavelength is absorbed substantially only by the host material. Herein, the excitation light at the proper wavelength is such a light that the absorbance to the light of the light-emitting material is $\frac{1}{10}$ or less to that of the host material. For example, in the case where the host material is selected, $Ir(ppy)_3$ being used as the light-emitting material, the mixture film is preferably evaluated while irradiating a light in the wavelength region of 330 to 350 nm, which is hardly absorbed by $Ir(ppy)_3$.

The light-emitting properties of the mixture film may be evaluated by: exciting the mixture film by irradiating the above-mentioned excitation light; and measuring fluorescence and/or phosphorescence spectrum thereof. The preferred combination of the host material and the light-emitting material is such that the mixture film composed thereof exhibits the fluorescence and/or phosphorescence spectrum corresponding mainly to the light-emitting material, hardly to the host material.

[2] Organic Light-Emitting Device

An organic light-emitting device of the present invention comprises a pair of electrodes and a light-emitting layer disposed therebetween, the light-emitting layer containing a combination of a host material and a light-emitting material selected by the above-mentioned method of the present invention. Weight ratio of the light-emitting material is preferably 1 to 10 weight % to the host material in the combination. Absorbance to the light, which is absorbed by the host material, of the light-emitting material is preferably ⅕ or less to that of the host material.

The organic light-emitting device may have a structure provided on a substrate such as: positive electrode/light-emitting layer/negative electrode; positive electrode/light-emitting layer/electron-transporting layer/negative electrode; positive electrode/hole-transporting layer/light-emitting layer/electron-transporting layer/negative electrode; positive electrode/hole-transporting layer/light-emitting layer/negative electrode; the reversed structure thereof; etc. The positive electrode is generally a transparent electrode, and the negative electrode is generally a metal electrode. The organic light-emitting device may comprise a plurality of the light-emitting layers, the hole-transporting layers, or the electron-transporting layers. Further, a hole-injecting layer may be disposed between the positive electrode and the light-emitting layer or the hole-transporting layer, and an electron-injecting layer may be disposed between the negative electrode and the light-emitting layer or the electron-transporting layer. Each component in the organic light-emitting device of the present invention will be described in detail below.

(A) Substrate

The substrate used in the present invention may be transparent or opaque. When the substrate is transparent, the organic light-emitting device may be composed of, for example, transparent substrate/transparent positive electrode/light-emitting layer/negative electrode. In the case of using an opaque substrate, the organic light-emitting device may be composed of opaque substrate/negative electrode/light-emitting layer/transparent positive electrode. In this case, the opaque substrate may also act as the negative electrode. The organic light-emitting device preferably has a structure allowing light emission from the transparent positive electrode side.

Used as the transparent substrate may be a glass substrate, a polycarbonate sheet, a polyethersulfone sheet, a polyester sheet, a poly(chlorotrifluorethylene) sheet, etc. On such a substrate may be provided a protection film made of silicon nitride, silicon oxide, etc. The opaque substrate may be: a metal plate of aluminum, iron, a stainless steel, nickel, an alloy composed thereof, etc.; an opaque plastic substrate; a ceramic substrate; etc. The metal plate may also act as the negative electrode. The organic light-emitting device of the present invention is essentially the same whether the substrate is transparent or opaque, so that the explanations for the device will be made below only with respect to the case of using the transparent substrate without intention of restricting the scope of the present invention.

(B) Positive Electrode

On the transparent substrate may be provided the positive electrode that acts to supply holes to the light-emitting layer. The positive electrode is generally made of a metal, an alloy, a metal oxide, an organic conductive compound, a mixture thereof, etc., preferably made of a material having a work function of 4.0 eV or more. Specific examples of a material for the positive electrode include: semiconductive metal oxides such as tin oxide, zinc oxide, indium oxide and ITO (Indium Tin Oxide); metals such as gold, silver, chromium and nickel; mixtures and laminations of the metal and a conductive metal oxide; inorganic conductive compounds such as copper iodide and copper sulfide; organic conductive compounds such as polyaniline, polythiophene and polypyrrole; laminations of the organic conductive compound and ITO; etc. Further, transparent electrically conductive films described in "Tomei-Dodenmaku no Shintenkai (Development of the Transparent Electrically Conductive Film)" (supervised by Yutaka Sawada, CMC, Ink., 1999), etc. may be used as the positive electrode.

Method for disposing the positive electrode is not particularly limited, may be selected depending on the material used therefor from: a wet method such as a printing method and a coating method; a physical method such as a vacuum deposition method, a sputtering method and an ion-plating method; a chemical method such as a CVD method and a plasma CVD method; etc. For example, an ITO positive electrode is preferably disposed by a direct or RF sputtering method, and a positive electrode of the organic conductive compound is preferably disposed by the wet method.

Thickness of the positive electrode is preferably 10 nm to 50 $\mu$m, more preferably 50 nm to 20 $\mu$m, although the thickness may be appropriately selected depending on the material used therefor. The resistance of the positive electrode is preferably $10^3$ $\Omega$/square or less, more preferably $10^2$ $\Omega$/square or less. Further, a light transmittance of the positive electrode is preferably 60% or more, more preferably 70% or more, to obtain light emission from the positive electrode side of the organic light-emitting device.

(C) Organic Layer

On the positive electrode is generally disposed at least one organic layer including the light-emitting layer. Thickness of the entire organic layer(s) is preferably 0.05 to 0.5 $\mu$m, more preferably 0.07 to 0.3 $\mu$m. If the thickness is less than 0.05 $\mu$m, the organic light-emitting device often causes dielectric breakdown when a voltage is applied thereto. On the other hand, the thickness of more than 0.5 $\mu$m demands a high voltage for light emission.

The organic layer may be disposed by a wet method such as a coating method, or a dry method such as a vapor deposition method and a sputtering method. In the case of using the wet method, the organic layer is preferably disposed by mixing the host material, the light-emitting material, the hole-transporting material, the electron-transporting material, etc. with a hole- or electron-transporting polymer such as a polyvinylcarbazole derivative and poly(p-phenylenevinylene) in a solvent, and by applying and drying the resultant solution. The host material may also act as the hole- or electron-transporting polymer. Further, the organic layer may be disposed by mixing the light-emitting material, etc. with an electrically inert polymer binder of a polycarbonate resin, a polystyrene resin, etc. in a solvent, and by applying and drying the resultant solution. A plurality of the organic layers may be multi-layered by applying solutions each using an appropriate solvent one by one. Specific examples of the wet method include dip-coating methods, spin-coating methods, casting methods, bar-coating methods, roll-coating methods, etc. In the case of using the dry method, the organic layer is disposed preferably by a vapor deposition method or a sputtering method, particularly preferably by a vacuum deposition method.

The hole-injecting material and the hole-transporting material used for the hole-injecting layer and the hole-transporting layer are not particularly limited if they have any function of: injecting the holes provided from the positive electrode into the light-emitting layer; transporting the holes to the light-emitting layer; and blocking the electrons provided from the negative electrode. Examples of the hole-injecting material and the hole-transporting material include carbazole compounds, triazole compounds, oxazole compounds, oxadiazole compounds, imidazole compounds, polyarylalkane compounds, pyrazoline compounds, pyrazolone compounds, phenylenediamine compounds, arylamine compounds, amino-substituted chalcone compounds, styrylanthracene compounds, fluorenone compounds, hydrazone compounds, stilbene compounds, silazane compounds, aromatic tertiary amine compounds, styrylamine compounds, aromatic dimethylidyne compounds, porphyrin compounds, polysilane compounds, poly(N-vinylcarbazole), aniline copolymers, oligothiophene, polythiophene, polyphenylene, polyphenylenevinylene, polyfluorene, derivatives thereof, mixtures thereof, etc.

The electron-injecting material and the electron-transporting material used for the electron-injecting layer and the electron-transporting layer are not particularly limited if they have any function of: injecting the electrons provided from the negative electrode into the light-emitting layer; transporting the electrons to the light-emitting layer; and blocking the holes provided from the positive electrode. Examples of the electron-injecting material and the electron-transporting material include triazole compounds, oxazole compounds, oxadiazole compounds, fluorenone compounds, anthraquinodimethane compounds, anthrone compounds, diphenylquinone compounds, thiopyran dioxide compounds, carbodimide compounds, fluorenylidenemethane compounds, distyrylpyrazine compounds, heterocyclic tetracarboxylic acid anhydrides such as naphthaleneperylene, phthalocyanine compounds, metal complexes such as 8-quinolinol metal complexes, metallophthalocyanines and metal complexes containing a ligand of a benzoxazole derivative or a benzothiazole derivative, polythiophene, polyphenylene, polyphenylenevinylene, polyfluorene, derivatives thereof, mixtures thereof, etc. Further, the electron-injecting layer may be made of a metal halide such as lithium fluoride and cesium fluoride, or a metal oxide such as aluminum oxide.

(D) Negative Electrode

On the organic layer may be provided the negative electrode that acts to supply electrons to the organic layer. The negative electrode may be made of a metal, an alloy, a metal oxide, an electrically conductive compound, a mixture thereof, etc. Specific examples of a material for the negative electrode include: alkali metals such as Li, Na and K, and fluorides thereof; alkaline earth metals such as Mg and Ca, and fluorides thereof; gold; silver; lead; aluminum; sodium-potassium alloys; lithium-aluminum alloys; magnesium-silver alloys; rare earth metals such as indium and ytterbium; etc. The material is preferably such that has a work function of 4.5 eV or less, more preferably aluminum, a lithium-aluminum alloy or a magnesium-silver alloy. Thickness of the negative electrode is preferably 10 nm to 5 $\mu$m, more preferably 50 nm to 1 $\mu$m, although the thickness may be appropriately selected depending on the material used therefor.

Method for disposing the negative electrode may be properly selected depending on the material used therefor from a sputtering method, a vacuum deposition method, a coating method, etc. A plurality of metals may be simultaneously deposited.

(E) Others

A protection layer may be provided on the outer surface of the positive electrode and/or the negative electrode. A material used for the protection layer may be any material so long as it acts to prevent moisture, oxygen, etc. promoting deterioration of the organic light-emitting device from penetrating the device. Examples of the material include silicon oxide, silicon dioxide, germanium oxide, germanium dioxide, etc. The protection layer may be formed by a vacuum deposition method, a sputtering method, an activated sputtering method, a molecular beam epitaxy method, a cluster ion beam method, an ion-plating method, a plasma polymerization method, a plasma CVD method, a laser CVD method, a thermal CVD method, a coating method, etc.

The organic light-emitting device may be sealed by a sealant such as a sealing plate and a sealing vessel using a sealing agent to shield the device from penetration of moisture, oxygen, etc. The sealant may be made of: a glass; a metal such as a stainless steel and aluminum; a plastic such as polyester and polycarbonate; a ceramic; etc. Used as the sealing agent may be ultraviolet-hardening resins, thermo-setting resins or two-part type hardening resins.

Further, a water-absorbing agent or an inert liquid may be interposed between the organic light-emitting device and the sealant. The water-absorbing agent is not particularly limited, may be barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, a zeolite, magnesium oxide, etc. The inert liquid is also not particularly limited, may be: paraffin; liquid paraffin; a fluorine-containing solvent such as perfluoroalkane, perfluoroamine and perfluorether; a chlorine-containing solvent; silicone oil; etc.

EXAMPLES

The present invention will be explained in further detail by the following examples without intention of restricting the scope of the present invention defined by the claims attached hereto.

Example 1

A glass substrate of 2.5 cm×2.5 cm in size and 0.5 mm in thickness was washed with ultrasonic wave in isopropylalcohol. Then, PMMA acetone solution (5 weight %) was spin-coated on this washed glass substrate and dried, to provide an inert polymer layer. The spin-coating was carried out at 800 rpm for 20 seconds.

1 mg of light-emitting material I (tris(2-phenylpyridine)-iridium complex, Ir(ppy)$_3$) and 15 mg of host material A shown below were dissolved in 5 ml of dichloroethane. The resultant solution was spin-coated on the above-described inert polymer layer at 500 rpm for 20 seconds and dried to prepare a mixture film of IA. Further, these steps were repeated except for using each of host materials B to F shown below instead of the host material A, to prepare mixture films of IB to IF, respectively. Incidentally, for example, "IA" means the combination of the light-emitting material I and the host material A.

A
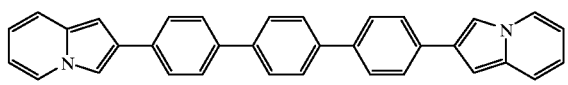

B
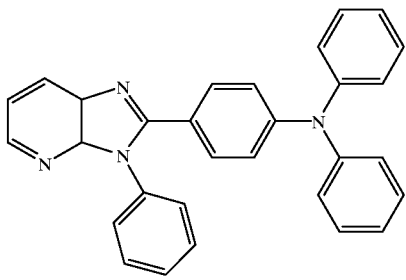

C
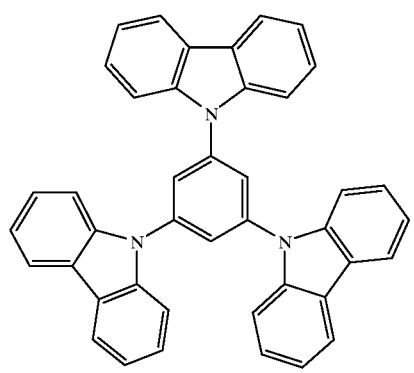

D
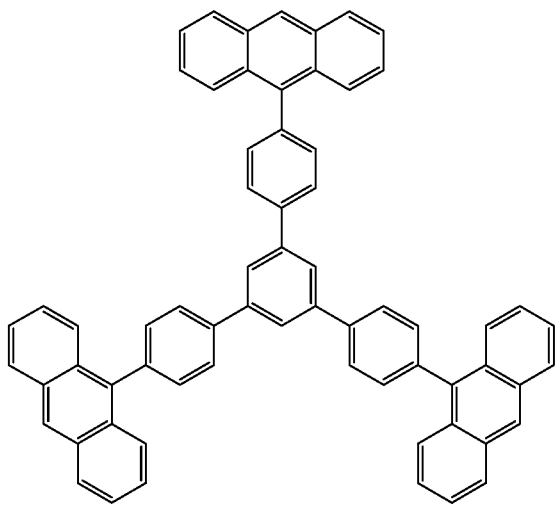

E
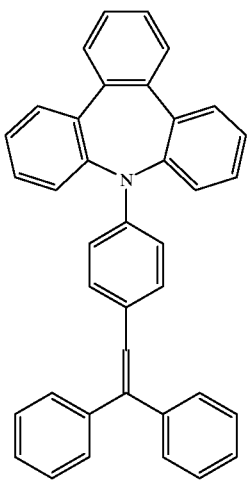

F
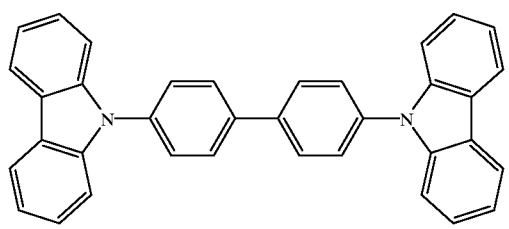

The mixture films of IA to IF were measured with respect to fluorescence spectrum in the range of 400 to 700 nm under the excitation wavelength of 350 nm by fluorescence spectrophotometer M-850 manufactured by Hitachi, Ltd. The results were shown in Table 1 as "first evaluation" according to the present invention, wherein "○" means that emission spectrum (fluorescence and/or phosphorescence spectrum) equal to that of deoxidized Ir(ppy)$_3$ solution was observed and emission spectrum corresponding to the host material was not observed; "Δ" means that emission spectra corresponding to both of Ir(ppy)$_3$ and the host material was observed; and "X" means that emission spectrum corresponding to Ir(ppy)$_3$ was not observed.

On a glass substrate of 2.5 cm×2.5 cm in size and 0.5 mm in thickness was sputtered ITO to a thickness of 250 nm by DC magnetron sputtering method, and the sputtered ITO was then patterned to obtain a transparent electrode. Herein, mole ratio of indium/tin in ITO was 95/5, and the surface resistance of the obtained transparent electrode was 6 Ω/square. The transparent electrode was washed with isopropylalcohol and subjected to an oxygen plasma treatment. Then, on the transparent electrode was disposed in the following order by vacuum deposition method: a hole-transporting layer of N,N'-diphenyl-N,N'-bis(1-naphtyl)-1,1'-biphenyl-4,4'-diamine (NPD) having a thickness of 40 nm; a light-emitting layer of the light-emitting material I (Ir(ppy)$_3$) and the host material A having a thickness of 24 nm; and a hole-blocking, electron-transporting layer of 2,2',2''-(1,3,5-benzentriyl) tris(3-phenyl-3H-imidazo[4,5-b]pyridine) having a thickness of 24 nm. Incidentally, the light-emitting layer was disposed by co-depositing Ir(ppy)$_3$ at the depositing rate of 0.1 nm/s and the host material at the depositing rate of 1 nm/s. On the hole-blocking, electron-transporting layer was disposed a negative electrode by depositing Mg-Ag alloy (Mg/Ag=10/1) in the thickness of 250 nm while using a patterned mask, and by further depositing Ag in the thickness of 300 nm thereon, to produce an organic light-emitting device using IA. Further, the above steps were repeated except for using each of the host materials B to F instead of the host material A, to prepare organic light-emitting devices using IB to IF, respectively.

Each of thus-obtained organic light-emitting devices was applied direct current voltage by Source-Measure Unit 2400 (TOYO Corporation), and measured with respect to emission wavelength by Spectral Analyzer PMA-11 manufactured by Hamamatsu Photonics K. K. The results were shown in Table 1 as "second evaluation", wherein "◯" means that emission wavelength corresponding to Ir(ppy)$_3$ was observed and emission wavelength corresponding to the host material was not observed; "Δ" means that emission wavelength corresponding to both of Ir(ppy)$_3$ and the host material was observed; and "X" means that emission wavelength corresponding to Ir(ppy)$_3$ was not observed. Further, each of the organic light-emitting devices exhibiting the emission wavelength corresponding to Ir(ppy)$_3$ was measured with respect to the external quantum efficiency at each luminance of 200 cd/m$^2$ and 2000 cd/m$^2$.

TABLE 1

| Combination | First Evaluation | Second Evaluation | External Quantum Efficiency at 200 cd/m$^2$ | at 2000 cd/m$^2$ |
|---|---|---|---|---|
| IA | X | X | — | — |
| IB | ◯ | ◯ | 12.3% | 10.9% |
| IC | ◯ | ◯ | 10.0% | 10.2% |
| ID | Δ | Δ | 0.1% | —[a] |
| IE | X | X | — | — |
| IF | ◯ | ◯ | 13.6% | 10.0% |

[a]: Luminance of 2000 cd/m$^2$ was not obtained.

As shown in Table 1, the first evaluation according to the method of the present invention provided the results equal to that of the second evaluation requiring production of the organic light-emitting device. It was found by the first evaluation that the host materials B, C and F were suitably used in combination with the light-emitting material I (Ir(ppy)$_3$). The organic light-emitting device using the host material B or C exhibited an excellent light-emitting efficiency similar to that of the device using the known host material F (CBP).

Example 2

The combinations of the light-emitting material II shown below and each host material E and F, IIE and IIF were evaluated in the same manner as Example 1, respectively. The results were shown in Table 2.

TABLE 2

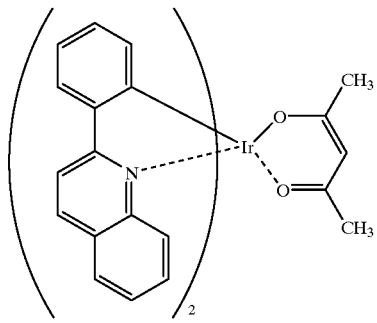

II

| Combination | First Evaluation | Second Evaluation | External Quantum Efficiency at 200 cd/m$^2$ | at 2000 cd/m$^2$ |
|---|---|---|---|---|
| IIE | X | X | — | — |
| IIF | ◯ | ◯ | 13.4% | 8.6% |

As shown in Table 2, it was found by the method of the present invention that the host material F was suitably used in combination with the light-emitting material II.

As described in detail above, a preferred combination of a host material and a light-emitting material to be used for a light-emitting layer of an organic light-emitting device can be easily selected by a method of the present invention. Further, an organic light-emitting device exhibiting high light-emitting efficiency can be obtained by using the preferred combination of the host material and the light-emitting material selected by the method.

What is claimed is:

1. A method for selecting a combination of a host material and a light-emitting material to be used for a light-emitting layer of an organic light-emitting device, comprising the steps of: (a) disposing a mixture film containing a host material and a light-emitting material on a substrate, wherein the light-emitting material emits phosphorescence from triplet exitons; and (b) evaluating said mixture film with respect to light-emitting properties while irradiating a light that is absorbed by said host material to said mixture film.

2. The method according to claim 1, wherein an inert polymer layer is provided on the mixture film side surface of said substrate.

3. The method according to claim 2, wherein said inert polymer layer is made of poly(methylmethacrylate).

4. The method according to claim 1, wherein said mixture film is disposed by applying a solution containing said host material and said light-emitting material to said substrate, and by drying the applied solution.

5. The method according to claim 1, wherein weight ratio of said light-emitting material is 1 to 10 weight % to said host material in said mixture film.

6. The method according to claim 1, wherein prior to production of the organic light-emitting device, the suitability of the host material and light-emitting material for use in the organic light-emitting device is determined by the method of claim 1.

7. An organic light-emitting device comprising a pair of electrodes and a light-emitting layer disposed therebetween, wherein said light-emitting layer contains a combination of a host material and a light-emitting material selected by a method comprising the steps of: (a) disposing a mixture film containing a host material and a light-emitting material on a substrate, wherein the light-emitting material emits phosphorescence from triplet exitons; and (b) evaluating said mixture film with respect to light-emitting properties while irradiating a light that is absorbed by said host material to said mixture film.

8. The organic light-emitting device according to claim 7, wherein said light-emitting layer is disposed by a vacuum deposition method.

9. The organic light-emitting device according to claim 7, wherein weight ratio of said light-emitting material is 1 to 10 weight % to said host material in said combination.

10. The organic light-emitting device according to claim 7, wherein absorbance to said light of said light-emitting material is $\frac{1}{5}$ or less to that of said host material in said combination.

11. An organic light-emitting device according to claim 7, wherein prior to production of the organic light-emitting device, the suitability of the host material and light-emitting material for use in the organic light-emitting device is determined by the method of claim 6.

* * * * *